United States Patent [19]
Sakuta et al.

[11] Patent Number: 5,062,712
[45] Date of Patent: Nov. 5, 1991

[54] ALIGNING APPARATUS WITH A COARSE/FINE MOVEMENT CONTROLLER AND AN ULTRAFINE MOVEMENT CONTROLLER

[75] Inventors: Shigeru Sakuta, Yokosuka; Katsunobu Ueda, Yokohama, both of Japan

[73] Assignee: Kabushiki Kaisha Toshiba, Kawasaki, Japan

[21] Appl. No.: 488,890

[22] Filed: Mar. 6, 1990

[30] Foreign Application Priority Data

| Mar. 7, 1989 | [JP] | Japan | 1-54601 |
| Mar. 7, 1989 | [JP] | Japan | 1-54602 |
| Dec. 28, 1989 | [JP] | Japan | 1-344352 |
| Feb. 7, 1990 | [JP] | Japan | 2-26131 |

[51] Int. Cl.$^5$ .......................................... G01B 11/14
[52] U.S. Cl. .................... 356/400; 356/358; 250/572
[58] Field of Search ............... 356/358, 363, 376, 399, 356/400, 401; 250/572

[56] References Cited

U.S. PATENT DOCUMENTS

| 4,378,709 | 4/1983 | Chitayat. | |
| 4,563,820 | 1/1986 | Isohata | 356/401 |
| 4,590,380 | 5/1986 | Tamaki. | |
| 4,654,571 | 3/1987 | Hinds | 318/687 |
| 4,676,649 | 6/1987 | Phillips | 356/401 |
| 4,971,445 | 11/1990 | Sato et al. | 356/376 |

FOREIGN PATENT DOCUMENTS 196711 10/1986 European Pat. Off. .

*Primary Examiner*—Samuel Turner
*Attorney, Agent, or Firm*—Oblon, Spivak, McClelland, Maier & Neustadt

[57] ABSTRACT

A coarse/fine movement aligning apparatus of this invention includes a coarse movmeent driver for coarsely moving an object to be aligned, a fine adjustment for finely adjusting the object to be aligned, a position detector for detecting the position of the object to be aligned, a coarse/fine movement controller for selectively and simultaneously operating the coarse movment driver and the fine adjustment on the basis of a difference between the detection position obtained by the position detector and the target position of the object to be aligned, and an ultrafine movement controller for ultrafinely operating the fine adjustment to cause the object to be aligned to coincide with the target position.

13 Claims, 11 Drawing Sheets

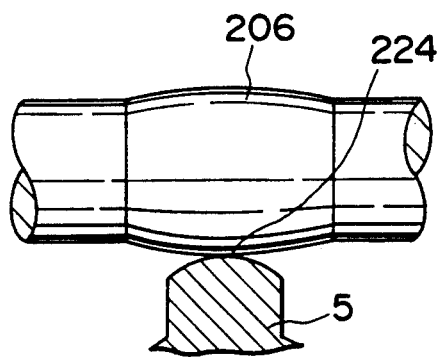
F I G. 5
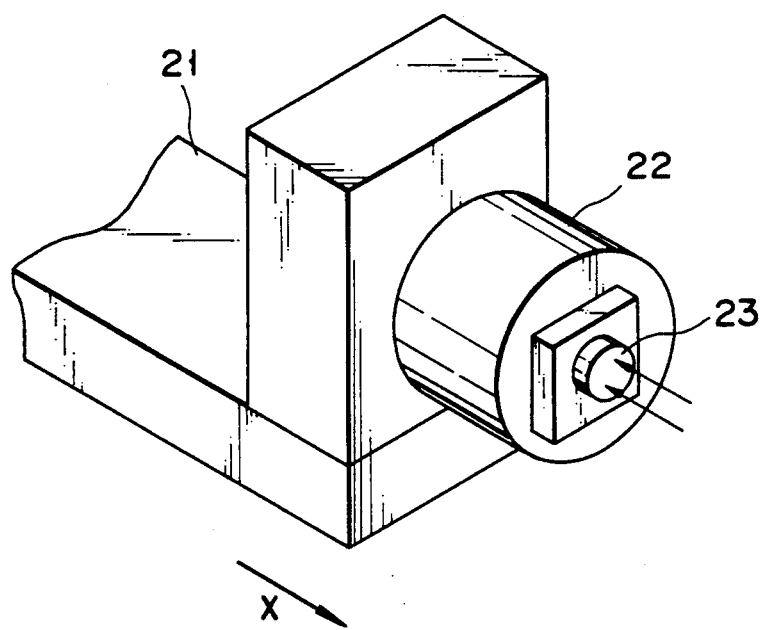
F I G. 6

DISPLACEMENT OF
PIEZOELECTRIC
ELEMENT

MOVEMENT BY
FRICTIONAL DRIVING
MECHANISM

MOVEMENT OF
REFLECTION MIRROR

APPLICATION VOLTAGE TO PIEZOELECTRIC ELEMENT

DRIVING SIGNAL TO FRICTIONAL DRIVING MECHANISM

MOVEMENT OF REFLECTION MIRROR

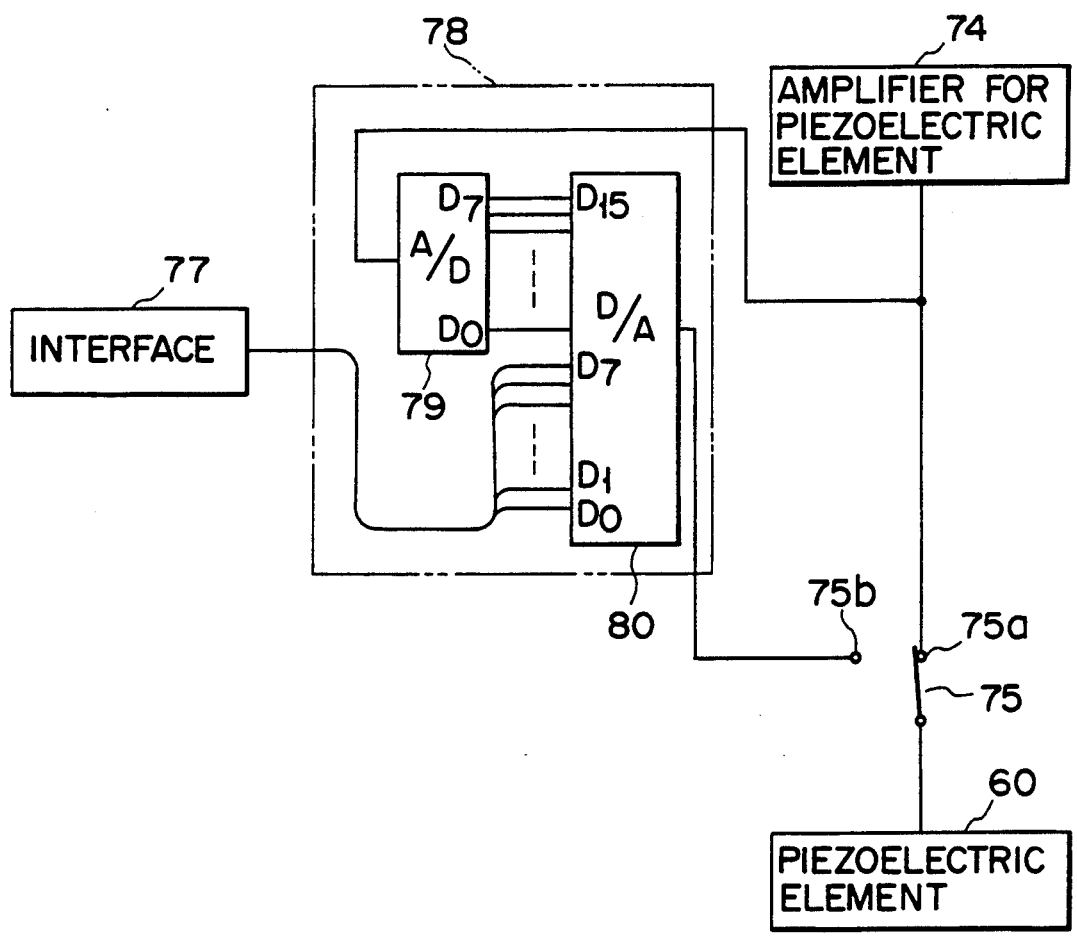
F I G. 12

ALIGNING APPARATUS WITH A COARSE/FINE MOVEMENT CONTROLLER AND AN ULTRAFINE MOVEMENT CONTROLLER

BACKGROUND OF THE INVENTION

1. Field of the Invention

The present invention relates to a coarse/fine movement aligning apparatus for linearly driving and aligning a table, a slider, or the like in a semiconductor manufacturing system which requires precise alignment.

2. Description of the Related Art

In a semiconductor manufacturing system, an information equipment, or a precision working machine, a table or the like is aligned. In this alignment, the table is linearly moved to cause it to coincide with a target position. As the alignment technique, dual control using both coarse and fine adjustments is known. The dual control will be briefly described below. The coarse adjustment moves a table toward a target position, and locates it near the target position. After the coarse adjustment is stopped, the fine adjustment finely moves the table to cause it to coincide with the target position. In this case, the position of the table is detected by a position sensor. Therefore the coarse adjustment moves the table in accordance with a deviation between the table position fed back from the position senso and the target position. The fine adjustment moves the table in accordance with a deviation between the table position fed back from a position sensor and the target position. Thus, alignment precision is restricted by detection precision of the position sensors.

SUMMARY OF THE INVENTION

It is an object of the present invention to provide a coarse/fine movement aligning apparatus which can achieve highly precise alignment.

According to the present invention, there is provided a coarse/fine movement aligning apparatus comprising a coarse movement driver for coarsely moving an object to be aligned, a fine adjustment for finely moving the object to be aligned, a position detector for detecting a position of the object to be aligned, a coarse/fine movement controller for selectively and simultaneously operating the coarse movement driver and fine adjustment on the basis of a difference between the position detected by the position detector and a target position of the object to be aligned, and an ultrafine movement controller for ultrafinely operating the fine adjustment to cause the object to be aligned to coincide with the target position.

According to the present invention, the coarse/fine movement controller selectively and simultaneously operates the coarse movement driver and the fine adjustment based on a difference between the position of the object to be aligned detected by the position detector and the target position. The ultrafine movement controller ultrafinely operates the fine adjustment to cause the object to be aligned to coincide with the target position.

According to the present invention, there is also provided a coarse/fine movement aligning apparatus comprising a rotational driving mechanism for generating a rotational force, a rotational shaft coupled to the rotational driving mechanism to be rotated, a support shaft juxtaposed with the rotational shaft, a driving rod which is in partial contact with the rotational shaft and the support shaft, is arranged to be movable in a direction perpendicular to the rotational shaft and the support shaft, and is moved upon rotation of the rotational shaft, a slider coupled to one end of the driving rod, a first static pressure bearing for injecting a fluid toward the driving rod to bring it into contact with the rotational shaft and the support shaft, a second static pressure bearing for injecting a fluid toward the slider to support it while floating the slider, a pressurized air supply device for independently supplying air to the first and second static pressure bearings, a first reflection mirror provided to the slider, a piezoelectric element fixed to the slider, a second reflection mirror provided to the piezoelectric element, a laser oscillator, a beam splitter for splitting a laser beam emitted from the laser oscillator into two split laser beams, a first interferometer for radiating the first split laser beam split by the beam splitter to the first reflection mirror, receiving the laser beam reflected by the first reflection mirror, and obtaining interference fringes of the reflected laser beam and the first split laser beam, a second interferometer for radiating the second split laser beam split by the beam splitter to the second reflection mirror, receiving the laser beam reflected by the second reflection mirror, and obtaining interference fringes of the reflected laser beam and the second split laser beam, a first receiver for converting the intensity of the interference fringes obtained by the first interferometer into an electrical signal, a second receiver for converting the interference fringes obtained by the second interferometer into an electrical signal, a coarse movement controller for obtaining a position of the first reflection mirror upon reception of the electrical signal from the first receiver, and sending a coarse driving signal corresponding to a deviation between the obtained position and a target position to the rotational driving mechanism, a fine movement controller for obtaining a position of the second reflection mirror upon reception of the electrical signal from the second receiver, and applying a fine driving signal corresponding to a deviation between the obtained position and the target position to the piezoelectric element, and an ultrafine movement controller for obtaining a voltage value corresponding to a desired displacement in accordance with to displacement-voltage characteristics of the piezoelectric element and applying the voltage value to the piezoelectric element.

According to the above-mentioned apparatus, when the rotational shaft is rotated by the rotational driving mechanism, the driving rod which is in partial contact with the rotational shaft and the support shaft is moved, and the slider coupled to the driving rod is moved. In this case, the driving rod is statically supported by the first static pressure bearing by air supplied from the pressurized air supply device, and the slider is statically supported by the second static pressure bearing by air supplied from the pressurized air supply device. Meanwhile, a laser beam emitted from the laser oscillator is split into two laser beams by the beam splitter. The first split laser beam is radiated onto the first reflection mirror arranged on the slider, and the laser beam reflected thereby is incident on the first interferometer. The first interferometer produces interference fringes of the reflected laser beam and the first split laser beam. The interference fringes is converted to an electrical signal by the first receiver The second split laser beam is radiated onto the second reflection mirror arranged on the piezoelectric element, and the laser beam reflected thereby is incident on the second interferometer. The second interferometer produces interference fringes of the reflected laser beam and the second split laser beam. The interference fringes is converted into an electrical signal by the second receiver. The coarse movement controller obtains the position of the first reflection mirror upon reception of the electrical signal from the first receiver, and supplies a coarse driving signal according to a deviation between the obtained position and the target position to the rotational driving mechanism. The fine movement controller obtains the position of the second reflection mirror upon reception of the electrical signal from the second receiver, and applies a fine driving signal according to a deviation between the obtained position and the target position to the piezoelectric element. The ultrafine movement controller obtains a voltage value according to a desired displacement in accordance with the displacement-voltage characteristics of the piezoelectric element, and applies the voltage value to the piezoelectric element.

Furthermore, according to the present invention: there is provided a coarse/fine movement aligning apparatus comprising a rotational driving mechanism for generating a rotational force, a rotational shaft coupled to the rotational driving mechanism to be rotated, a support shaft juxtaposed with the rotational shaft, a driving rod which is in partial contact with the rotational shaft and the support shaft, is arranged to be movable in a direction perpendicular to the rotational shaft and the support shaft, and is moved upon rotation of the rotational shaft, a slider coupled to one end of the driving rod, a first static pressure bearing for injecting a fluid toward the driving rod to bring it into contact with the rotational shaft and the support shaft, a second static pressure bearing for injecting a fluid toward the slider to support it while floating the slider, a pressurized air supply device for independently supplying air to the first and second static pressure bearings, a piezoelectric element fixed to the slider, a reflection mirror provided to the piezoelectric element, a laser oscillator, an interferometer for radiating a laser beam emitted from the laser oscillator to the reflection mirror, receiving the laser beam reflected by the reflection mirror, and obtaining interference fringes of the reflected laser beam and the laser beam, a receiver for converting the intensity of the interference fringes obtained by the interferometer into an electrical signal, a coarse movement controller for obtaining a position of the reflection mirror upon reception of the electrical signal from the receiver, and sending a coarse driving signal corresponding to a deviation between the obtained position and a target position to the rotational driving mechanism, a fine movement controller for obtaining the position of the reflection mirror upon reception of the electrical signal from the receiver, and applying, to the piezoelectric element, a voltage signal which changes stepwise in accordance with a deviation between the obtained position and the target position, a main controller for issuing an operation instruction to the coarse and fine movement controllers, obtaining a plurality of ultrafine movement voltages obtained by dividing a one-step voltage difference of the voltage signal applied from the fine movement controller to the piezoelectric element, and outputting the obtained voltages as digital values, and an ultrafine movement controller for obtaining a voltage value corresponding to the target position on the basis of the ultrafine movement digital voltages output from the main controller and the voltage signal applied from the fine movement controller to the piezoelectric element in an interpolation manner, and additionally applying the obtained voltage value to the piezoelectric element.

According to the above-mentioned apparatus, when the rotational shaft is rotated by the rotational driving mechanism, the driving rod which is in partial contact with the rotational shaft and the support shaft is moved, and the slider coupled to the driving rod is moved. In this case, the driving rod is statically supported by the first static pressure bearing by air supplied from the pressurized air supply device, and the slider is statically supported by the second static pressure bearing by air supplied from the pressurized air supply device. Meanwhile, a laser beam emitted from the laser oscillator is radiated onto the reflection mirror arranged on the slider, and the laser beam reflected thereby is incident on the interferometer. The interferometer produces interference fringes of the reflected laser beam and the laser beam. The interference fringes is converted to an electrical signal by the receiver. The coarse movement controller obtains the position of the reflection mirror upon reception of the electrical signal from the receiver, and supplies a coarse driving signal according to a deviation between the obtained position and the target position to the rotational driving mechanism. The fine movement controller obtains the position of the reflection mirror upon reception of the electrical signal from the receiver, and applies, to the piezoelectric element, a voltage signal which changes stepwise according to a deviation between the obtained position and the target position. The main controller obtains a plurality of ultrafine movement voltages obtained by dividing a one-step voltage difference of the voltage signal to be applied from the fine movement controller to the piezoelectric element, and outputs the obtained voltages as digital values. The ultrafine movement controller obtains a voltage value according to the target position on the basis of the ultrafine movement digital voltages output from the main controller and the voltage signal applied from the fine movement controller to the piezoelectric element in an interpolation manner, and additionally applies the obtained voltage value to the piezoelectric element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a view showing a contact state of a driving rod and a rotational shaft in the frictional driving mechanism;

FIG. 6 is a perspective view showing an outer appearance of a piezoelectric element;

FIG. 12 is a circuit diagram of an ultrafine movement aligning circuit.

DETAILED DESCRIPTION OF THE PREFERRED EMBODIMENTS

Figure 1:
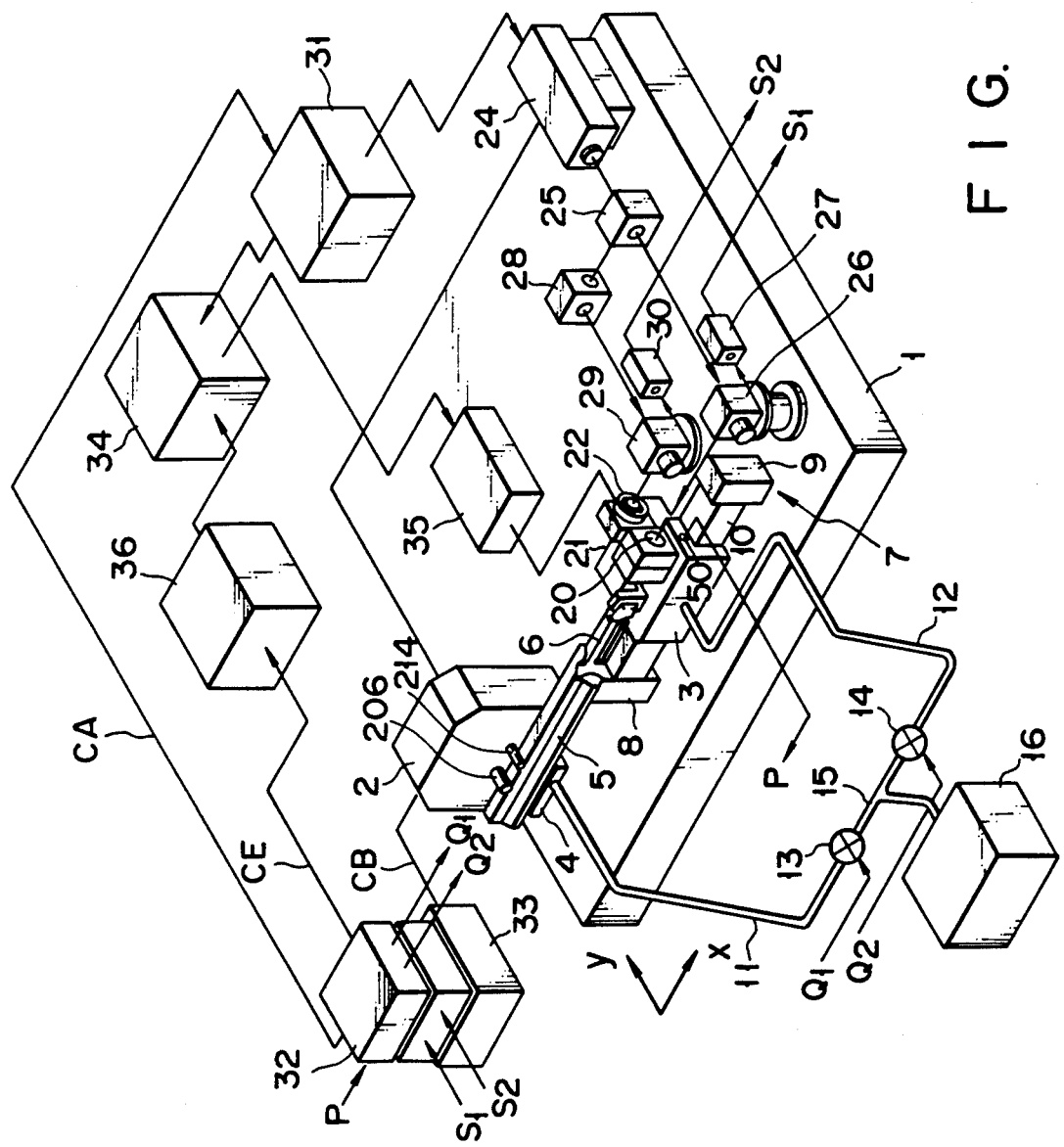
FIG. 1 is a perspective view showing an arrangement of a coarse/fine movement aligning apparatus according to the first embodiment of the present invention.

The first embodiment of the present invention will be described hereinafter.

A frictional driving mechanism 2 is arranged on a support base 1. The frictional driving mechanism 2 linearly moves a slider 3. The frictional driving mechanism 2 comprises a first static pressure bearing 4. The first static pressure bearing 4 statically supports a driving rod 5. The slider 3 is coupled to the distal end of the driving rod 5 through a coupling member 6. The slider 3 is statically supported by a second static pressure bearing 7. In the second static pressure bearing 7, a guide 10 is supported by support bases 8 and 9. The guide 10 extends through the slider 3. A large number of holes are formed in the slider 3, and air is injected from these holes to support the guide 10.

A first air supply pipe 11 is connected to the first static pressure bearing 4, and a second air supply pipe 12 is connected to the slider 3 of the second static pressure bearing 7. The first air supply pipe 11 is connected to a first servo valve 13, and the second air supply pipe 12 is connected to a second servo valve 14. These servo valves 13 and 14 are commonly connected to an air pressure supply source 16 through an air supply pipe 15. The air pressure supply source 16 pressurizes air and supplies the pressurized air through the air supply pipes 11 and 12.

Figure 2:
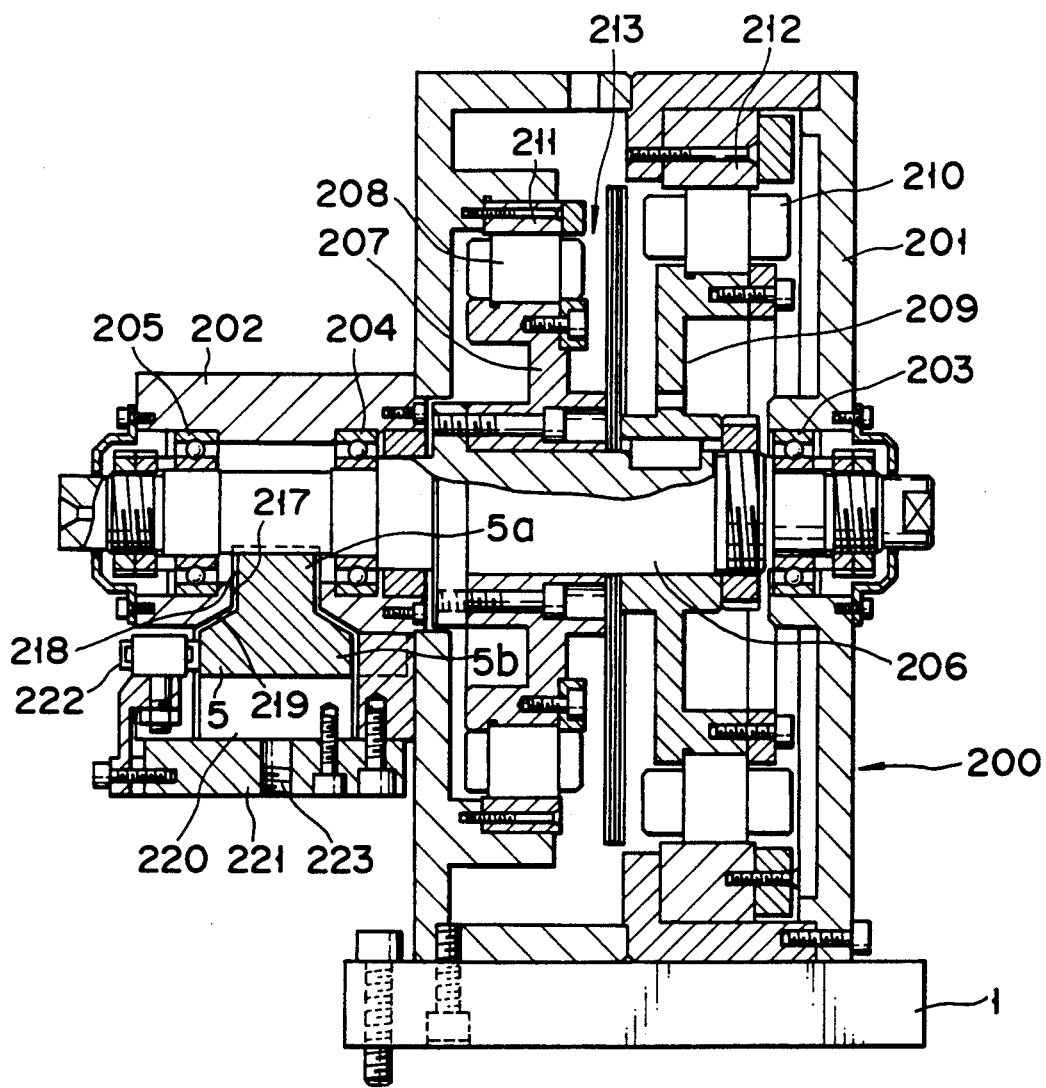
FIG. 2 is a sectional view of a frictional driving mechanism of the apparatus shown in FIG. 1
Figure 3:
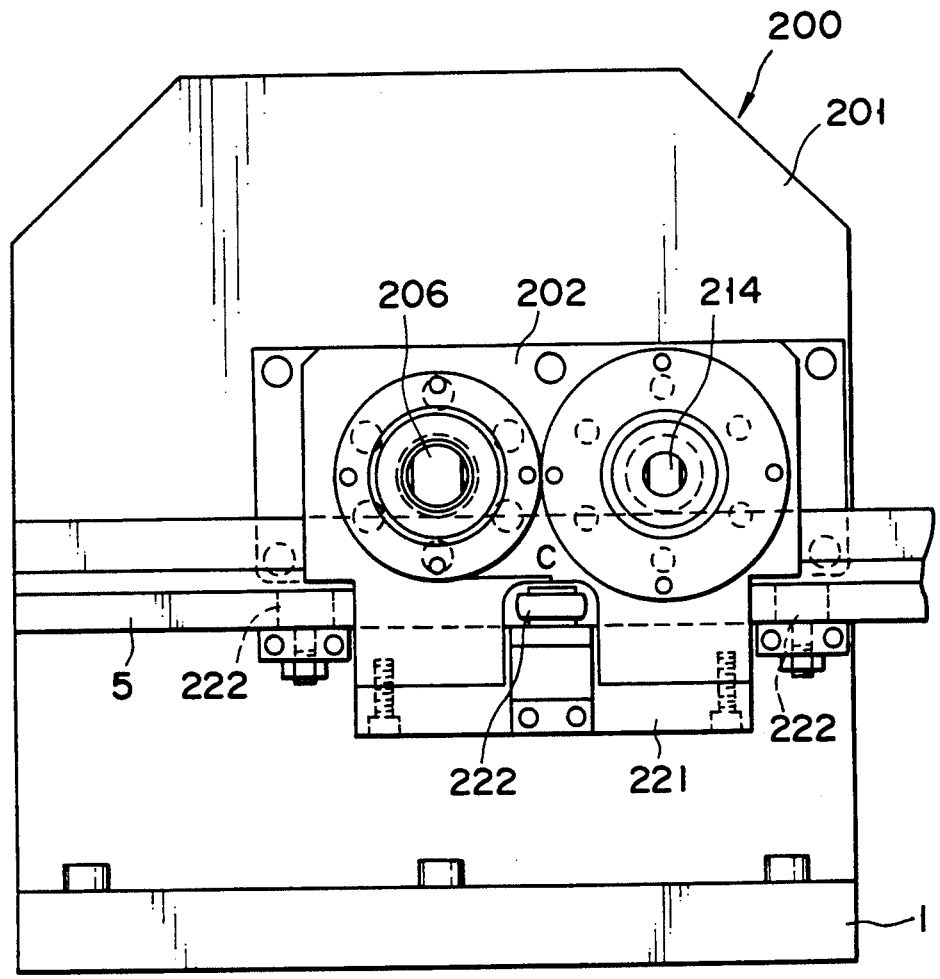
FIG. 3 is a side view of the frictional driving mechanism.
Figure 4:
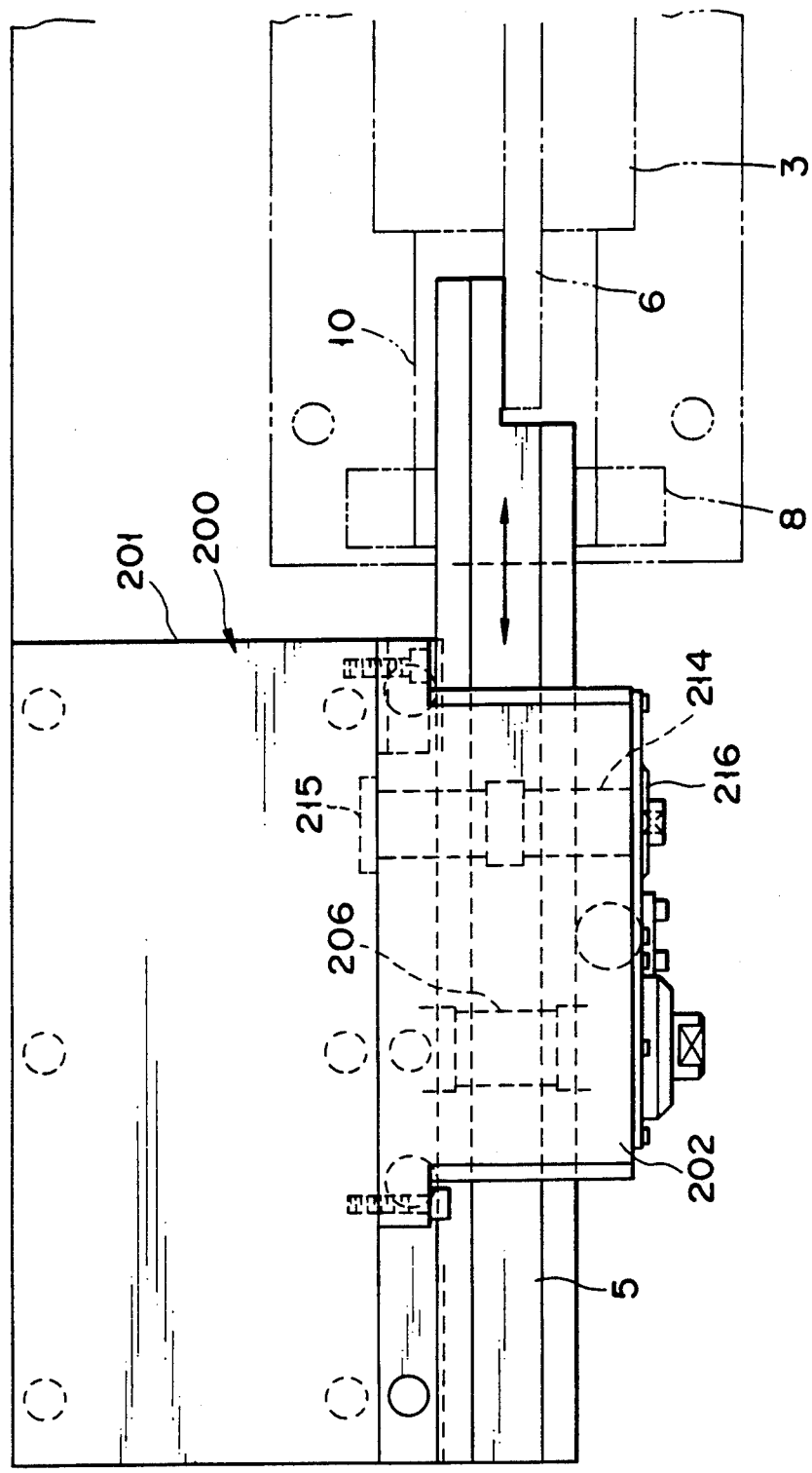
FIG. 4 is a top view of the frictional driving mechanism.

The detailed arrangement of the frictional driving mechanism 2 will be described below with reference to FIG. 2.

The frictional driving mechanism 2 is constituted by the following components formed of stainless steel. That is, the frictional driving mechanism 2 is constituted by a motor housing 200 fixed on the support base 1 and a shaft housing 202 fixed to one side wall of the motor housing 201. The motor housing 201 has a ball bearing 203, and the shaft housing 202 has ball bearings 204 and 205. These ball bearings 203, 204, and 205 are coaxially arranged. These ball bearings 203, 204, and 205 axially support a rotational shaft 206 in a horizontal state to be rotatable. A motor rotor 208 is fixed, through a mounting ring 207, to a portion of the rotational shaft 206 which portion is located inside the motor housing 201. A tacho generator 210 is fixed, through a mounting ring 209, to a portion of the rotational shaft 206 which portion is located inside the motor housing 201. A motor stator 211 and a tacho generator stator 212 are fixed to the inner peripheral wall of the motor housing 201. Thus, a rotational driving mechanism 213 is constituted by the motor stator 211 and the motor rotor 208.

A support shaft 214 is arranged in the shaft housing 202 to be parallel to the rotational shaft 206. The support shaft 214 is formed into a cylindrical shape. The support shaft 214 is rotatably and axially supported at its two end portions by ball bearing 215 and 216. An opening 217 is formed in a lower wall of the shaft housing 202. The opening 217 extends in a direction perpendicular to the rotational shaft 206 and the support shaft 214. The upper portion of the opening 217 is formed into a small-width portion 218, and its lower portion is formed into a large-width portion 219 which is tapered downward The opening 217 communicates with a compression chamber 220. The compression chamber 220 is defined by a casing 221 fixed to the lower portion of the shaft housing 202. A driving rod 5 is inserted in the opening 217. The driving rod 5 has a small-width portion 5a and a large-width portion 5b. The small- and large-width portions 5a and 5b have shapes which respectively fit with the small- and large-width portions 218 and 219. Therefore, the driving rod 5 is movable vertically, i.e., in a direction perpendicular to the rotational shaft 206. The driving rod 5 extends in a direction perpendicular to the rotational shaft 206. Two side surfaces located at an intermediate portion of the driving rod 206 are supported by three guide rollers 222 provided to the casing 221. The first air supply pipe 11 is connected to and communicates with the compression chamber 220 through a port 223. Therefore, when air is supplied to the compression chamber 220 through the first air supply pipe 11, the driving rod 5 is urged against the rotational shaft 206 and the support shaft 214. A contact state between the driving rod 5 and the rotational shaft 206 is as shown in FIG. 5. A contact portion 224 between the driving rod 5 and the rotational shaft 206 has a toroidal shape. The contact portion 224 of the driving rod 5 with the rotational shaft 206 and the support shaft 214 has a convex surface perpendicular to a moving direction. Thus, the driving rod 5 is in line contact with the rotational shaft 206. Therefore, the driving rod 5 is not easily partially worn.

A first reflection mirror 20 is mounted on the slider 3, and an auxiliary plate 21 is fixed thereon. A piezoelectric element 22 is provided to the auxiliary plate 21. The piezoelectric element 22 is formed of a $Pb(Zr,Ti)O_3$ (PZT) material. The piezoelectric element 22 is formed into a columnar shape, as shown in FIG. 6, and displaces in an X direction upon application of a voltage. A second reflection mirror 23 is provided to the distal end of the piezoelectric element 22. Alignment of this apparatus is performed with respect to the second reflection mirror 23.

An He-Ne laser oscillator (to be simply referred to as a laser oscillator hereinafter) 24 of a laser measuring system is arranged on the support base 1. A beam splitter 25 is arranged in a laser output direction of the laser oscillator 24. The beam splitter 25 splits a laser beam output from the laser oscillator 24 into two beams, i.e., first and second split laser beams. In one of split directions of the beam splitter 25, a first interferometer 26 is arranged. The first interferometer 26 allows the first split laser beam to pass therethrough and outputs it toward the first reflection mirror 20. The first interferometer 26 receives the laser beam reflected by the first reflection mirror 20 to obtain interference fringes between the reflected laser beam and the first split laser beam. A first receiver 27 is arranged on the support base 1. The first receiver 27 receives the interference fringes produced by the first interferometer 26, and converts it into an electrical signal $S_1$ corresponding to the intensity of the interference fringes. In the other split direction of the beam splitter 25, a bender 28 is arranged. The bender 28 deflects the second split laser beam through 90° and outputs it. In the laser output direction of the bender 28, a second interferometer 29 is arranged. The second interferometer 29 allows the second split laser beam to pass therethrough and outputs it toward the second reflection mirror 23. The second interferometer 29 receives the laser beam reflected by the second reflection mirror 23 to obtain interference fringes of the reflected laser beam and the second split laser beam. A second receiver 30 is arranged on the support base 1. The second receiver 30 receives the interference fringes produced by the second interferometer 29, and converts it into an electrical signal $S_2$ corresponding to the intensity of the interference fringes. Note that the laser oscillator 24 is subjected to laser beam output control by a laser controller 31.

A main controller 32 has coarse movement control, fine movement control, and ultrafine movement control functions. In the coarse movement control function, the controller 32 obtains the position of the first reflection mirror 20 upon reception of the electrical signal $S_1$ from the first receiver 27, and outputs a coarse driving signal CB for setting a deviation between the obtained position and a target position to be zero. The main controller 32 and the frictional driving mechanism 2 are connected through an amplifier 33. Therefore, the coarse driving signal CB is amplified by the amplifier 33, and is then sent to the frictional driving mechanism 2. Thus, coarse movement control is achieved by a feedback control system.

In the fine movement control function, the controller 32 obtains the position of the second reflection mirror 23 upon reception of the electrical signal $S_2$ from the second receiver 30, and outputs a fine driving signal CA for setting a deviation between the obtained position and the target position to be zero. The fine driving signal CA is a voltage signal. The fine driving signal CA is supplied to an ultrafine movement controller 34 through the laser controller 31, and is then applied to the piezoelectric element 22 through an amplifier 35. Thus, fine movement control is achieved by a feedback control system.

In the ultrafine movement control function, displacement-voltage characteristics of the piezoelectric element 22 are stored, and a voltage value CE corresponding to a desired displacement is obtained in accordance with the displacement-voltage characteristics. The voltage value CE is output as a digital signal. The ultrafine movement digital voltage value CE is supplied to the ultrafine movement controller 34 through a board 26. Thus, ultrafine movement control is achieved by an open loop.

Figure 7:
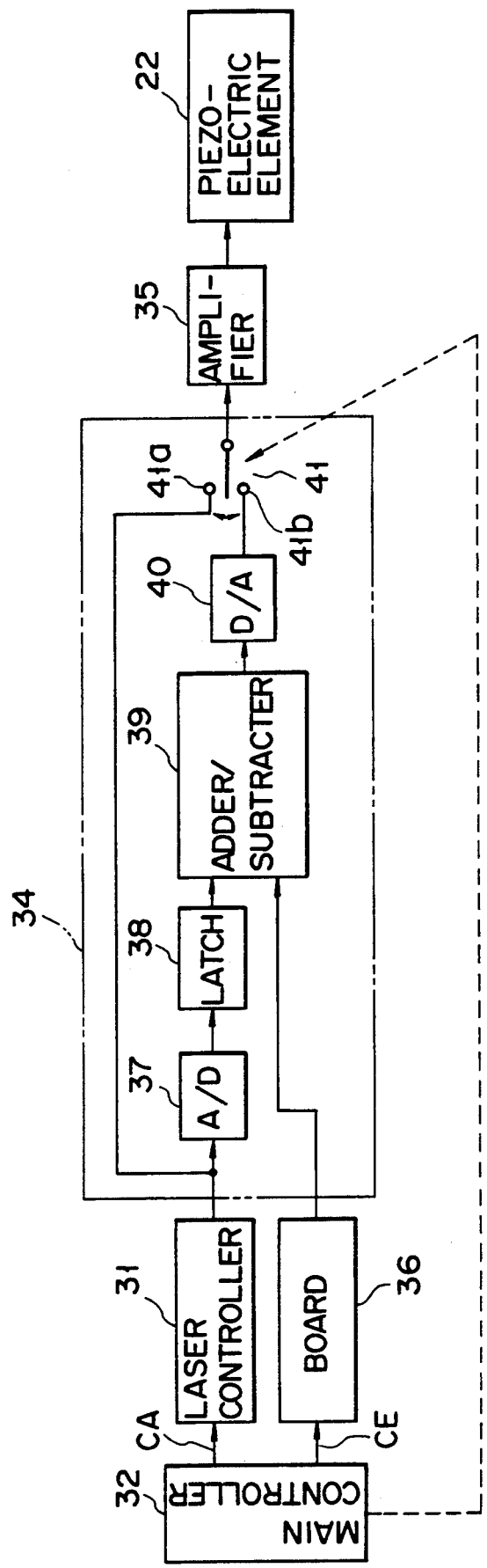
FIG. 7 is a block diagram of a fine movement controller.

The ultrafine movement controller 34 has a function of sending the fine driving signal CA to the piezoelectric element 22 and latching the signal CA, and a function of adding/subtracting the ultrafine movement digital voltage value CE and a voltage value obtained by A/D-converting the latched fine driving signal CA and D/A converting the adding/subtracting and thereafter sending a analog signal to the piezoelectric element 22. FIG. 7 shows the detailed arrangement of the ultrafine movement controller 34. The ultrafine movement controller 34 comprises an A/D converter 37 for A/D-converting the fine driving signal CA, a latch 38 for latching the digital fine driving signal from the A/D converter 37, an adder/subtracter 39 for adding/subtracting the output from the latch 38 and the ultrafine movement digital voltage value sent through the board 36, a D/A converter 40 for D/A-converting the output from the adder/subtracter 39, and a solenoid switch 41 for switching between the fine driving signal CA and the conversion output of the D/A converter 40. In the solenoid switch 41, a terminal 41a is connected to the laser controller 31, and a terminal 41b is connected to the output terminal of the D/A converter 40. The solenoid switch 41 is switched to one of the terminals 41a and 41b in response to a switching instruction from the main controller 32.

An acceleration pickup 50 is provided to the front end face of the slider 3. The acceleration pickup 50 detects a vibration of the slider 3 in real time in an alignment control mode. A detection signal P from the acceleration pickup 50 is supplied to the main controller 32. Therefore, the main controller 32 has a function of supplying, to the first servo valve 13, a control signal $Q_1$ of an optimal air pressure for minimizing the vibration of the slider 3, and supplying a second control signal $Q_2$ to the second servo valve 14 upon reception of the detection signal P. These control signals respectively indicate degrees of opening of the first and second servo valves 13 and 14. The slider 3 and the frictional driving mechanism 2 have different optimal air pressures. The optimal air pressure for the slider 3 changes depending on the mass, surface roughness, throttle shape, interbearing gap, and the like of the slider 3. The optimal air pressure for the frictional driving mechanism 2 depends on the mechanical strength, assembly precision, parts working precision, and the like of the driving rod 5.

The operation of the apparatus with the above arrangement will be described below.

The main controller 32 executes coarse movement control. The main controller 32 issues an operation instruction to the frictional driving mechanism 2, and also issues an operation instruction to the laser controller 31. Upon reception of the operation instruction, the laser controller 31 operates the laser oscillator 24 to emit a laser beam. The laser beam emitted from the laser oscillator 24 is split into two beams by the beam splitter 25. The first split laser beam of the two split beams reaches the first reflection mirror 20 through the first interferometer 26. The first split laser beam is reflected by the reflection mirror 20, and becomes incident on the first interferometer 26 again. The first interferometer 26 produces interference fringes upon incidence of the laser beam from the laser oscillator 24 and the reflected first split laser beam. The intensity of the interference fringes is determined according to an interval between the first reflection mirror 20 and the first interferometer 26, i.e., according to the position of the first reflection mirror 20. The interference fringes is guided to the first receiver 27. The first receiver 27 converts the light into the electrical signal $S_1$ as a voltage corresponding to the intensity of the interference fringes. The other, e.g., second split laser beam is deflected by the bender 28, and is guided toward the second interferometer 29. The second interferometer 29 allows the second split laser beam to pass therethrough and outputs it toward the second reflection mirror 23. The second split laser beam is reflected by the reflection mirror 23, and becomes incident on the second interferometer 29 again. The second interferometer 29 produces interference light upon incidence of the laser beam from the laser oscillator 24 and the reflected second split laser beam. The intensity of the interference fringes is determined according to an interval between the second reflection mirror 23 and the second interferometer 29, i.e., according to the position of the second reflection mirror 23. The interference fringes is guided to the second receiver 30. The second receiver 30 converts the light into the electrical signal $S_2$ as a voltage corresponding to the intensity of the interference fringes. The electrical signals $S_1$ and $S_2$ are supplied to the main controller 32. In this case, since the main controller 32 is executing the coarse movement control, it ignores the electrical signal $S_2$.

Upon reception of the electrical signal $S_1$, the main controller 32 obtains the position of the first reflection mirror 20, and outputs the coarse driving signal CB for setting a deviation between this position and the target position to be zero. The coarse driving signal CB is amplified by the amplifier 33, and is sent to the frictional driving mechanism 2. Upon reception of the coarse driving signal CB, the frictional driving mechanism 2 moves the driving rod 5.

The air pressure supply source 16 supplies air to the air supply pipe 15. The air is supplied to the first static pressure bearing 4 through the first servo valve 13 and the first air supply pipe 11. The air is also supplied to the second static pressure bearing 7 through the second servo valve 14 and the second air supply pipe 12. The first static pressure bearing 4 injects the supplied air toward the driving rod 5. Thus, the driving rod 5 is floated. The second static pressure bearing 7 injects the supplied air from the slider 3 to the guide 10. Thus, the slider 3 is floated.

The operation of the frictional driving mechanism 2 will be described below.

Upon reception of the coarse driving signal CB, the frictional driving mechanism 2 energizes the rotational driving mechanism 213. Upon energization, the rotational shaft 206 is rotated. The air is supplied to the compression chamber 220 through the first air supply pipe 11. Thus, the driving rod 5 is floated by the air pressure, and the rotational shaft 206 and the support shaft 214 are brought into line contact with each other. In this line contact state, the driving rod 5 gives a given pressing force to the rotational shaft 206 and the support shaft 214. Therefore, a predetermined frictional force acts on the contact portion 224, and the driving rod 5 is rotated in the tangential direction of the rotational shaft 206 upon rotation of the rotational shaft 206. In this case, the driving rod 5 is supported from both the sides by the guide rollers 222. For this reason, the driving rod 5 can be smoothly linearly moved, and this linear movement is transmitted to the slider 3 through a coupling member 65. As a result, the slider 3 is moved along the guide 10.

Upon movement of the slider 3, the acceleration pickup 50 detects a vibration of the slider 3 in real time. The detection signal P from the acceleration pickup 50 is supplied to the main controller 32. Upon reception of the detection signal P, the main controller 32 obtains an optimal air pressure for minimizing the vibration of the driving rod 5, and supplies the control signal $Q_1$ of the optimal air pressure to the first servo valve 13. Upon reception of the detection signal P, the main controller 32 also obtains an optimal air pressure for minimizing the vibration of the slider 3, and supplies the control signal $Q_2$ of the optimal air pressure to the second servo valve 14. Thus, the vibration of the slider 3 is minimized. According to experiments of the present inventors, the vibration is decreased as follows. When an air pressure supplied to the first static pressure bearing 4 is set to be 3 kgf/cm$^2$ and an air pressure supplied to the second static pressure bearing 7 is set to be 2 kgf/cm$^2$, the magnitude of the vibration is 20 to 30 nm. However, when the air pressure supplied to the first static pressure bearing 4 is set to be 2 kgf/cm$^2$ and the air pressure supplied to the static pressure bearing 7 is set to be 2 kgf/cm$^2$ the magnitude of the vibration is decreased to 5 nm.

When the second reflection mirror 23 approaches the target position by the above-mentioned coarse movement, the main controller 32 stops the coarse movement control, and then executes fine movement control. In this case, the second reflection mirror 23 is separated from the target position by a distance corresponding to the alignment precision of the coarse movement control.

Upon execution of the fine movement control, the main controller 32 issues a switching instruction for switching the solenoid switch 41 to the terminal 41a side. The main controller 32 receives the electrical signal $S_2$ from the second receiver 30 to obtain the position of the second reflection mirror 23, and outputs the fine driving signal CA for setting a deviation between this position and the target position to be zero. The fine driving signal CA is a voltage signal. The fine driving signal CA is applied to the piezoelectric element 22 through the laser controller 31, the ultrafine movement controller 34, and the amplifier 35. Thus, the piezoelectric element 22 is displaced in accordance with the applied voltage value. This displacement of the element 22 aligns the second reflection mirror 23 with the target position. Note that the alignment precision corresponds to the position detection precision of the second reflection mirror 23 obtained from the output of the laser measuring system using the laser oscillator 24, i.e., the electrical signal $S_2$ from the second receiver 30.

Figure 8A:
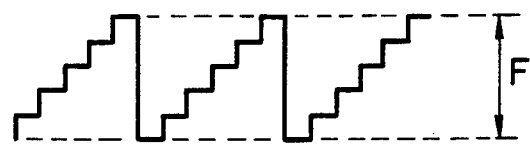
FIGS. 8A-8C are charts showing a reflection mirror displaced by coarse and fine movements.
Figure 8B:
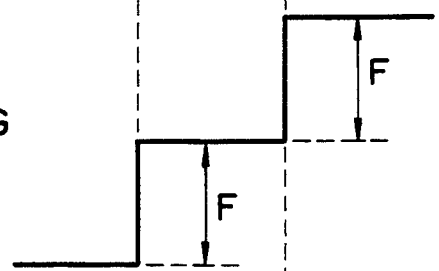
Figure 8C:
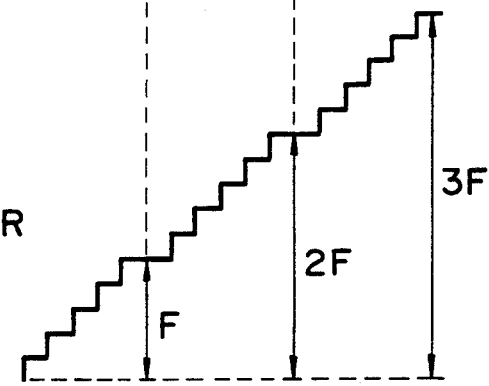
Figure 9:
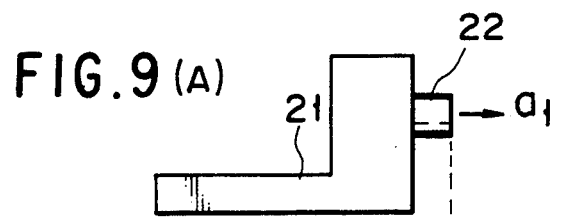
FIGS. 9A-9E show the reflection mirror moved by the coarse and fine movements.
Figure 9:
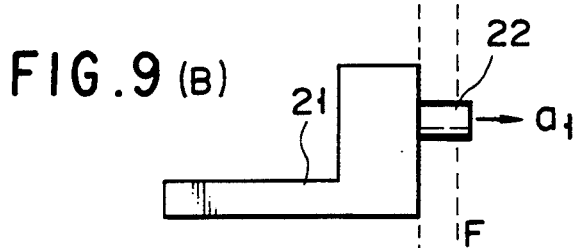
Figure 9:
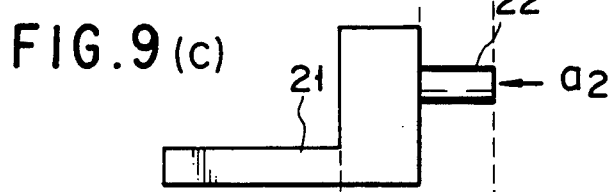
Figure 9:
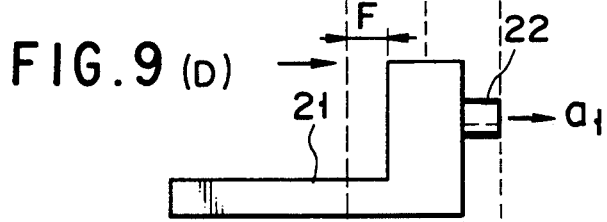
Figure 9:
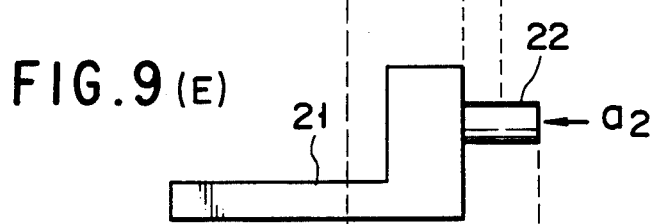
Figure 9:
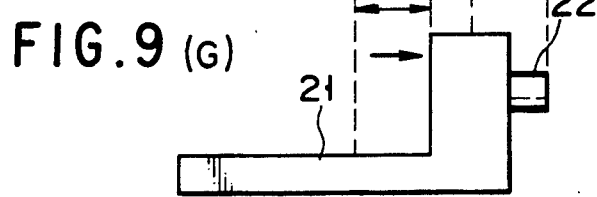
Figure 10A:
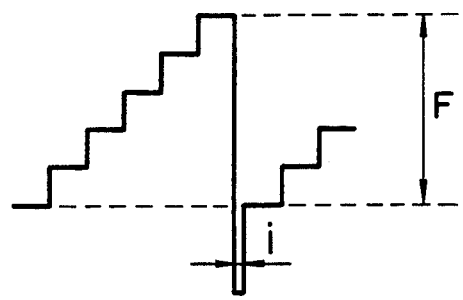
FIGS. 10A-10C are charts showing a voltage to be actually applied to the piezoelectric element in the coarse and fine movements.
Figure 10B:
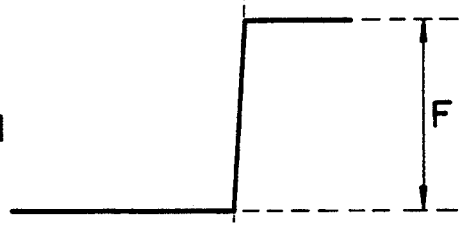
Figure 10C:

In the above description, the fine movement is executed after the coarse movement. However, the fine and coarse movements may be alternately and simultaneously executed. AN operation in this case will be described below. The main controller 32 outputs a fine driving signal CA whose voltage value is increased stepwise. The fine driving signal CA is applied to the piezoelectric element 22 through the laser controller 31, the ultrafine movement controller 34, and the amplifier 35, as described above. Thus, the piezoelectric element 22 is displaced stepwise, as shown in FIG. 8. For example, first, piezoelectric element 22 is assumed to be positioned at a certain position, when application voltage to piezoelectric element 22 is $V_0$. More specifically, the piezoelectric element 22 is displaced stepwise in a direction of an arrow $a_1$, as shown in states A and in FIG. 9. When the displacement of the piezoelectric element 22 reaches a maximum displacement F shown in a state C, the main controller 32 sets an application voltage to the piezoelectric element 22 to be $V_0$, and at the same time, outputs a coarse driving signal CB representing the displacement F to the frictional driving mechanism 2. Thus, the piezoelectric element 22 is displaced in a direction of an arrow $a_2$, i.e., contracts. The frictional driving mechanism 2 moves the driving rod 5 by the displacement F in the direction of the arrow $a_1$. As a result, the reflection mirror 23 is v moved by the displacement F as compared to the state A, as shown in a state D. The main controller 32 outputs a fine driving signal CA whose voltage value is increased stepwise, again. The fine driving signal CA is applied to the piezoelectric element 22 through the abovementioned path. Thus, the piezoelectric element 22 is displaced stepwise and reaches the maximum displacement F, as shown in a state E. When the maximum displacement F is reached, the main controller 32 sets an application voltage to the piezoelectric element 22 to be $V_0$, and at the same time, outputs a coarse driving signal CB representing the displacement F to the frictional driving mechanism 2. As a result, the reflection mirror 23 is moved by the displacement 2F as compared to the state A, as shown in a state G. The coarse and fine movements are alternately executed, thus aligning the second reflection mirror to the target position.

The application voltage to the piezoelectric element is increased stepwise, and is set to be $V_0$ when the piezoelectric element reaches the maximum displacement F. The application voltage to the piezoelectric element 22 is increased stepwise again. However, when the application voltage to the piezoelectric element 22 is merely set to be $V_0$, the second reflection mirror 23 vibrates during an operation of the frictional driving mechanism 2. Therefore, in practice, the application voltage to the piezoelectric element 22 is decreased below $V_0$, and thereafter, is increased stepwise. In this case, the coarse driving signal CB is output during a period i in which the application voltage to the piezoelectric element 22 is decreased below $V_0$. Thus, the vibration of the second reflection mirror 23 is suppressed.

When the second reflection mirror 23 is aligned by the coarse and fine movements, the main controller 32 executes ultrafine movement control. The main controller 32 switches the solenoid switch 41 to the terminal 41b. In this case, the main controller 32 has stored the application voltage value to the piezoelectric element 22 which was output in the fine movement control mode. Therefore, the main controller 32 obtains a deviation between the present and target positions of the second reflection mirror 23 on the basis of the application voltage to the piezoelectric element 22. The main controller 32 obtains a voltage value for finely displacing the piezoelectric element 22 on the basis of this deviation. For example, the voltage-displacement characteristics of the piezoelectric element 22 are represented by 0.1 nm/1 V. An application voltage value to the piezoelectric element 22 during alignment in the fine movement control mode is 100 V. In order to displace the piezoelectric element 22 from this state in the X direction by 0.5 nm, a voltage of 5 V need only be applied to the piezoelectric element 22. Therefore, the main controller 32 outputs a digital value of the ultrafine movement voltage of 5 V. The digital voltage value of 5 V is supplied to the ultrafine movement controller 34 through the board 36. The latch 38 of the controller 34 has latched the application voltage of 100 V to the piezoelectric element 22 in the fine movement control mode as a digital value. Therefore, the adder/subtracter 39 adds the application voltage of 100 V to the piezoelectric element 22, and the ultrafine movement digital voltage value of 5 V, and outputs a digital voltage value of 105 V. The digital voltage value of 105 V is amplified by the amplifier 35 through the solenoid switch 41, and is then applied to the piezoelectric element 22. Thus, the piezoelectric element 22 is displaced ultrafinely (by 0.5 nm). As a result, the second reflection mirror 23 is aligned to the target position. The alignment precision is higher than that in the fine movement control using the laser measuring system. When the second reflection mirror 23 is moved by a displacement of 0.25 nm in the ultrafine movement control mode, the main controller 32 outputs an ultrafine movement digital voltage value of 2.5 V. When the second reflection mirror 23 is moved by a displacement of 0.5 nm in a negative direction of X, the main controller 32 outputs an ultrafine movement digital voltage value of $-5$ V.

According to the first embodiment, the coarse and fine movement control functions are selectively and simultaneously executed based on a difference between the detection position of the second reflection mirror 23 by the laser measuring system and the target position, and the piezoelectric element 22 is then ultrafinely moved by the ultrafine movement control, thus aligning the second reflection mirror 23 to the target position. Therefore, the second reflection mirror 23 can be aligned with higher precision (resolution) than in the laser measuring system in addition to large-stroke, high-speed alignment by the coarse and fine movement control. In the ultrafine movement control mode, since a voltage corresponding to the displacement-voltage characteristic is applied to the piezoelectric element 22, high-precision alignment can be performed with any displacement. In the conventional dual control, alignment precision never exceeds 1.25 to 2.5 nm. However, in the apparatus of this embodiment, alignment can be performed with a high precision of 0.1 nm or less.

Since the frictional driving mechanism 2 and the slider 3 respectively comprise the static pressure bearings 4 and 7, a vibration upon movement of the slider 3 can be eliminated. In addition, since the acceleration pickup 50 detects the vibration of the slider 3 and controls air pressures to be supplied to the static pressure bearings 4 and 7, the magnitude of the vibration of the slider 3 can be suppressed below 5 nm. Thus, the second reflection mirror can be aligned with a precision of 10 nm or less by the coarse movement control. Note that the magnitude of the vibration of the slider 3 varies depending on a stroke. When the slider 3 has a long stroke, a gap between the slider 3 and the guide 10 varies depending on the position of the slider 3. Such a variation is caused by surface roughness or the like of the slider 3. Therefore, the acceleration pickup is arranged at an alignment position of the slider 3. In the first embodiment, the acceleration pickup is preferably arranged at the position where the second reflection mirror 23 is arranged.

As described above, the apparatus of this embodiment is best suitable for driving of a slider or a table in a semiconductor manufacturing system, an information equipment, a precision working machine, and the like.

Figure 11:
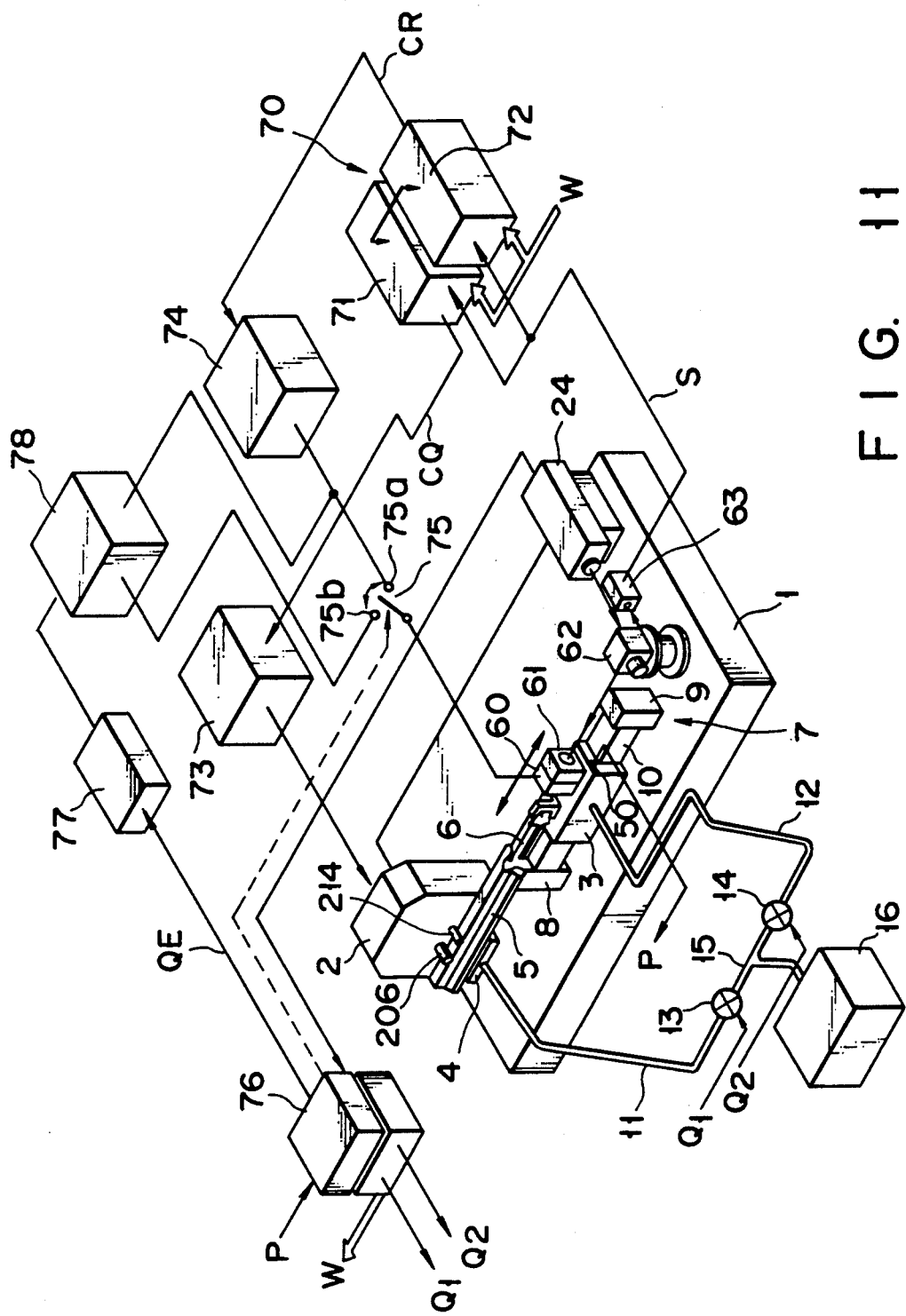
FIG. 11 is a perspective view of a coarse/fine movement aligning apparatus according to the second embodiment of the present invention.

The second embodiment of the present invention will be described below with reference to FIG. 11. The same reference numerals in the second embodiment denote the same parts as in the first embodiment, and a detailed description thereof will be omitted.

A piezoelectric element 60 is arranged on a slider 3. The piezoelectric element 60 is formed of PZT. A reflection mirror 61 is arranged on the front surface of the piezoelectric element 60. In this apparatus, the reflection mirror 61 is aligned.

An interferometer 62 is arranged in a laser output direction a laser oscillator 24. The interferometer 62 outputs a laser beam emitted from the laser oscillator toward the reflection mirror 61, and receives the laser beam reflected by the mirror 61. The interferometer 62 receives the laser beam emitted from the laser oscillator 24 and the laser beam reflected by the reflection mirror 61 to produce interference finges. The interference fringes is output toward a receiver 63. The receiver 63 receives the interference fringes, and outputs an electrical signal S according to the intensity of the interference fringes A laser controller 70 comprises a coarse movement controller 71 and a fine movement controller 72. The coarse movement controller 71 receives the electrical signal S from the receiver 63 to obtain the position of the reflection mirror 61, and outputs a coarse driving signal CQ for setting a deviation between this position and a target position to be zero. The coarse driving signal CQ is amplified by a frictional driving amplifier 73, and the amplified signal is sent to a frictional driving mechanism 2. The fine movement controller 72 receives the electrical signal S from the receiver 63 to obtain the position of the reflection mirror 61, and outputs a fine driving signal CR for setting a deviation between this position and CR the target position to be zero. The fine driving signal CR is a voltage signal. The fine driving signal is amplified by an amplifier 74 for the piezoelectric element. The amplified signal is applied to the piezoelectric element 60 through a switch 75. The switch 75 has terminals 75a and 75b. The amplifier 74 is connected to the terminal 75a.

A main controller 76 has a function of issuing an operation instruction W to the coarse and fine movement controllers 71 and 72. The main controller 76 connects the switch 75 to the terminal 75a in coarse and fine control modes, and connects it to the terminal 75b in an ultrafine control mode. The main controller 76 obtains ultrafine movement voltages obtained by dividing a voltage difference of a minimum stroke to be applied from the fine movement controller 72 to the piezoelectric element 60 using an interpolation method, and outputs digital values corresponding to these voltages as an instruction QE. The ultrafine movement digital value ultrafinely moves the piezoelectric element 60 by a stroke $1/2^8$ of a detection resolution (a minimum detectable stroke) of a laser measuring system. This instruction QE is supplied to an ultrafine movement aligning circuit 78.

The ultrafine movement aligning circuit 78 outputs a voltage value for aligning the mirror to the target position on the basis of the instruction QE from the main controller 76 and the voltage signal applied from the fine movement controller 72 to the piezoelectric element 60. For example, when the position of the reflection mirror 61 is represented by $x_2$, an application voltage to the piezoelectric element 60 is $v_2$. When the position of the reflection mirror 61 is represented by $x_3$, an application voltage to the piezoelectric element 60 is $v_3$. In this case, in order to move the reflection mirror 61 to a position $x_{3.5}$ as a middle point between the positions $x_2$ and $x_3$, an application voltage to the piezoelectric element 60 is given by:

$$v_{3.5} = v_2 + (v_3 - v_2)/2$$

Therefore, if $(v_3 - v_2)$ represents the resolution of the laser measuring system, alignment can be performed with a resolution ½ that of the laser measuring system.

FIG. 12 shows the detailed arrangement of the ultrafine movement aligning circuit 78. The ultrafine movement aligning circuit 78 comprises an 8-bit A/D converter 79, and a 16-bit D/A converter 80. The A/D converter 79 has output terminals $D_0$ to $D_7$. The D/A converter 80 has input terminals $D_0$ to $D_{15}$. The A/D converter 79 receives an application voltage to the piezoelectric element 60, which is amplified by the amplifier 74. The output terminals $D_0$ to $D_7$ of the A/D converter 79 are connected to the upper 8-bit input terminals $D_8$ to $D_{15}$ of the D/A converter 80. The output terminal of the D/A converter 80 is connected to the terminal 75b of the switch 75. For example, the reflection mirror 61 is assumed to be aligned to a position $x_5$. In this case, the output terminals $D_0$ to $D_7$ of the A/D converter 79 are at low level. Assume that the reflection mirror 61 is aligned at a position $x_6$. In this case, the output terminal $D_0$ of the A/D converter 79 goes to high level, and the remaining output terminals $D_1$ to $D_7$ go to low level. When the reflection mirror 61 is aligned at the position $x_5$, low-level signals are input to the input terminals $D_0$ to $D_{15}$ of the D/A converter 80. When the reflection mirror 61 is aligned at the position $x_6$, low-level signals are input to the input terminals $D_0$ to $D_7$ of the D/A converter 80, a high-level signal is input to the input terminal $D_8$, and low-level signals are input to the input terminals $D_9$ to $D_{15}$. In this state, the main controller 76 issues an instruction QE for setting the input terminal $D_0$ of the D/A converter 80 at high level. When the input terminal $D_0$ of the D/A converter 80 goes to high level, the D/A converter 80 D/A-converts and outputs an application voltage va given by:

$$va = (v_6 - v_5)/(2^8 - 1)$$

This analog voltage is applied to the piezoelectric element 60 through the switch 75. As a result, the piezoelectric element 60 is displaced by:

$$(x_6 - x_5)/(2^8 - 1)$$

When the main controller 76 issues an instruction QE for setting the input terminal $D_1$ of the D/A converter 80 at high level, the D/A converter 80 D/A-converts and outputs an application voltage vb given by:

$$vb = (v_6 - v_5) \times 2/(2^8 - 1)$$

As a result, the piezoelectric element 60 is displaced by:

$$(x_6 - x_5) \times 2/(2^8 - 1)$$

Furthermore, when the main controller 76 issues an instruction QE for setting the input terminal $D_7$ of he D/A converter 80 at high level, the piezoelectric element 60 is displaced by:

$$(x_6 - x_5) \times 2^7/(2^8 - 1)$$

The operation of the apparatus with the above arrangement will be described below. The same operation as in the first embodiment will be omitted.

The main controller 76 executes coarse movement control. The main controller 76 issues operation instructions to the coarse movement controller 71 and the laser oscillator 24, and connects the switch 75 to the terminal 75a. The laser beam output from the laser oscillator 24 reaches the reflection mirror 61 through the interferometer 62. The laser beam is reflected by the reflection mirror 61, and becomes incident on the interferometer 62 again. The interferometer 62 produces interference fringes upon reception of the laser beam from the laser oscillator 24 and the reflected laser beam. The intensity of the interference fringes corresponds to an interval between the reflection mirror 61 and the interferometer 62. The interference fringes is guided toward the receiver 63. The receiver 63 converts the interference fringes into an electrical signal S having a voltage value corresponding to its intensity. The electrical signal S is supplied to the main controller 76.

The main controller 76 obtains the position of the reflection mirror 61 upon reception of the electrical signal S, and outputs a coarse driving signal CQ for setting a deviation between this position and the target position to be zero. This coarse driving signal CQ is amplified by the amplifier 73, and is sent to the frictional driving mechanism 2. The frictional driving mechanism 2 moves the driving rod 5 upon reception of the coarse driving signal CQ.

When the reflection mirror 61 approaches the target position by the coarse movement, the main controller 76 stops the coarse movement control, and then executes fine movement control. Upon execution of the fine movement control, the main controller 76 switches the switch 75 to the terminal 75b. The main controller 76 receives the electrical signal S from the receiver 63 to obtain the position of the reflection mirror 61, and outputs a fine driving signal CR for setting a deviation between this position and the target position to be zero. The fine driving signal CR is a voltage signal. The fine driving signal CR is applied to the piezoelectric element 60 through the amplifier 74 and the switch 75. The piezoelectric element 60 is displaced according to the applied voltage value.

In the above operation, the fine movement is executed after coarse movement. However, the coarse and fine movements may be alternately and simultaneously executed. In this case, the same operation as described above with reference to FIG. 8 in the first embodiment is executed.

When the reflection mirror 61 is aligned by the coarse and fine movements, the main controller 76 executes ultrafine movement control. The main controller 76 stops the operation of the laser controller 70, and issues an instruction QE to the ultrafine movement aligning circuit 78. The instruction QE represents a difference between the present and target positions of the reflection mirror 61. The instruction QE corresponds to a stroke $1/2^8$ of the resolution of the laser measuring system. Assume that the reflection mirror 61 is located at the position $x_5$, and a difference between the position $x_5$ and the target position is given by:

$$(x_6-x_5)/2^7.$$

In this case, the main controller 76 issues an instruction QE for setting the input terminal $D_1$ of the D/A converter 80 at high level. Upon reception of the instruction QE, the D/A converter 80 D/A-converts and outputs a voltage given by:

$$vb=(v_6-v_5)\times 2/(2^8-1)$$

Thus, the piezoelectric element 60 is displaced by:

$$(x_6-x_5)/2^7$$

As a result, the reflection mirror 61 is aligned to the target position.

In this manner, according to the second embodiment, alignment can be performed with a resolution $1/2^8$ that of the laser measuring system. In addition, the vibration of the slider 3 can be eliminated as in the first embodiment.

The present invention is not limited to the first and second embodiments.

For example, the piezoelectric element 22 or 60 may comprise PZT, PbTiO$_3$ (PT), (Pb,La)(Zr,Ti)O$_3$ (PLZT), or three elements based on PZT. The piezoelectric element may be replaced with an electrostrictive element. The frictional driving mechanism 2 may be replaced with a mechanism employing a ball screw when a linear motor is used. The laser measuring system may be replaced with a position detection means using a linear encoder, a strain gauge, or the like. Furthermore, when the driving rod 5 has a convex shape, the contact portion of the rotational shaft 206 may have a cylindrical surface.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A coarse/fine movement aligning apparatus comprising:
    coarse movement driving means for coarsely moving
    fine adjustment means for finely moving the object to be aligned;
    position detection means for detecting a position of the object to be aligned;
    coarse/fine movement control means for selectively and simultaneously operating said coarse movement driving means and said fine adjustment means based on a difference between the detection position by said position detection means and a target position of the object to be aligned; and
    ultrafine movement control means for ultrafinely operating said fine adjustment means to cause the object to be aligned to coincide with the target position.

2. An apparatus according to claim 1, wherein said fine adjustment means comprises one of a piezoelectric element and an electrostrictive element.

3. An apparatus according to claim 2, wherein said piezoelectric element comprises a three-element system selected from the group consisting of Pb(Zr,Ti)O$_3$, PbTiO$_3$, (Pb,La)(Zr,Ti)O$_3$, and Pb(Zr,Ti)O$_3$.

4. A coarse/fine movement aligning apparatus comprising:
    a rotational driving mechanism for generating a rotational force;
    a rotational shaft coupled to said rotational driving mechanism to be rotated;

a support shaft juxtaposed to be parallel to said rotational shaft;

a driving rod which is in partial contact with said rotational shaft and said support shaft, is arranged to be movable in a direction perpendicular to said rotational shaft and said support shaft, and is moved upon rotation of said rotational shaft;

a slider coupled to one end of said driving rod;

a bearing for pre-loading said driving rod by injecting air toward said driving rod to bring said driving rod into contact with said rotational shaft and said support shaft;

a bearing of said slider for injecting air toward said slider to support said slider while floating said slider;

a pressurized air supply device for independently supplying air to said first and second static pressure bearings;

a first reflection mirror provided to said slider;

a piezoelectric element fixed to said slider;

a second reflection mirror provided to said piezoelectric element;

a laser oscillator;

a beam splitter for splitting a laser beam emitted from said laser oscillator into two laser beams;

a first interferometer for radiating a first split laser beam split by said beam splitter onto said first reflection mirror, receiving a laser beam reflected by said first reflection mirror, and obtaining interference fringes of the reflected laser beam and the first split laser beam;

a second interferometer for radiating a second split laser beam split by said beam splitter onto said second reflection mirror, receiving a laser beam reflected by said second reflection mirror, and obtaining interference fringes of the reflected laser beam and the second split laser beam;

a first receiver for converting the interference fringes obtained by said first interferometer into an electrical signal;

a second receiver for converting the interference fringes obtained by said second interferometer into an electrical signal;

a coarse movement controller for obtaining a position of said first reflection mirror upon reception of the electrical signal from said first receiver, and supplying a coarse driving signal corresponding to a deviation between the obtained position and a target position to said rotational driving mechanism;

a fine movement controller for obtaining a position of said second reflection mirror upon reception of the electrical signal from said second receiver, and applying a fine driving signal corresponding to a deviation between the obtained position and the target position to said piezoelectric element; and an ultrafine movement controller for obtaining a voltage value corresponding to a desired displacement in accordance with displacement-voltage characteristics of said piezoelectric element, and applying the obtained voltage value to said piezoelectric element.

5. An apparatus according to claim 4, wherein said laser oscillator comprises an He-Ne laser oscillator.

6. An apparatus according to claim 4, wherein said piezoelectric element comprises a three-element system selected from the group consisting of $Pb(Zr,Ti)O_3$, $PbTiO_3$, $(Pb,La)(Zr,Ti)O_3$, and $Pb(Zr,Ti)O_3$.

7. An apparatus according to claim 4, wherein said pressurized air supply device comprises a first air supply pipe connected to said bearing for pre-loading said driving rod, a second air supply pipe connected to said bearing of said slider, a first servo valve provided to said first air supply pipe, a second servo valve provided to said second air supply pipe, and a pressurized air supply source for supplying air to said bearing for pre-loading said driving rod, and to said bearing of said slider, through said first and second air supply pipes, respectively.

8. An apparatus according to claim 4, wherein said ultrafine movement controller comprises an ultrafine movement voltage calculator for storing the displacement-voltage characteristics of said piezoelectric element and calculating a voltage value corresponding to a desired deviation of said piezoelectric element, an A/D converter for A/D-converting the fine driving signal into a digital fine driving signal, a latch for latching the digital fine driving signal output from said A/D converter, an adder/subtracter for adding/subtracting an output from said latch and the voltage value calculated by said ultrafine movement voltage calculator, a D/A converter for D/A-converting an addition/subtraction output of said adder/subtracter, and a solenoid switch for selectively supplying the fine driving signal and a conversion output of said D/A converter to said piezoelectric element.

9. A coarse/fine movement aligning apparatus comprising:

a rotational driving mechanism for generating a rotational force;

a rotational shaft coupled to said rotational driving mechanism to be rotated;

a support shaft juxtaposed to be parallel to said rotational shaft;

a driving rod which is in partial contact with said rotational shaft and said support shaft, is arranged to be movable in a direction perpendicular to said rotational shaft and said support shaft, and is moved upon rotation of said rotational shaft;

a slider coupled to one end of said driving rod;

a bearing for pre-loading said driving rod by injecting a fluid toward said driving rod to bring said driving rod into contact with said rotational shaft and said support shaft;

a bearing of said slider for injecting a fluid toward said slider to support said slider while floating said slider;

a pressurized air supply device for independently supplying air to said bearing for pre-loading said driving rod and said bearing of said slider;

a piezoelectric element fixed to said slider;

a reflection mirror provided to said piezoelectric element;

a laser oscillator;

an interferometer for radiating a laser beam emitted from said laser oscillator onto said reflection mirror, receiving a laser beam reflected by said reflection mirror, and obtaining interference fringes of the reflected laser beam and the laser beam;

a receiver for converting the interference fringes obtained by said interferometer into an electrical signal;

coarse movement controller for obtaining a position of said reflection mirror upon reception of the electrical signal from said receiver, and supplying a coarse driving signal corresponding to a deviation between the obtained position and a target position to said rotational driving mechanism;

a fine movement controller for obtaining a position of said reflection mirror upon reception of the electrical signal from said receiver, and applying a voltage signal which changes stepwise in accordance with a deviation between the obtained position and the target position to said piezoelectric element;

a main controller for issuing an operation instruction to said coarse and fine movement controllers, obtaining a plurality of ultrafine movement voltages obtained by dividing a one-step voltage difference of the voltage signal to be applied from said fine movement controller to said piezoelectric element, and outputting the obtained voltages as digital values; and an ultrafine movement controller for obtaining a voltage value corresponding to the target position in accordance with the ultrafine movement digital voltage values from said main controller and the voltage signal applied from said fine movement controller to said piezoelectric element in an interpolation manner, and additionally applying the obtained voltage value to said piezoelectric element.

10. An apparatus according to claim 9, wherein said laser oscillator comprises an He-Ne laser 11. An apparatus according to claim 9, wherein said piezoelectric element comprises a three-element system selected from the group consisting of $Pb(Zr,Ti)O_3$, $PbTiO_3$, $(Pb,La)(Zr,Ti)O_3$, and $Pb(Zr,Ti)O_3$.

12. An apparatus according to claim 9, wherein said pressurized air supply device comprises a first air supply pipe connected to said bearing for pre-loading said driving rod, a second air supply pipe connected to said bearing of said slider, a first servo valve provided to said first air supply pipe, a second servo valve provided to said second air supply pipe, and a pressurized air supply source for supplying air to said bearing for pre-loading said driving rod and said bearing of said slider through said first and second air supply pipes, respectively.

13. An apparatus according to claim 9, wherein said ultrafine movement controller comprises an A/D converter for converting the voltage signal to be applied to said piezoelectric element into a digital signal, and a D/A converter for receiving the digital signal output from said A/D converter at upper-bit input terminals, receiving the ultrafine movement digital voltage values from said main controller at lower-bit input terminals, converting the digital values input at said input terminals into an analog signal, and applying the analog signal to said piezoelectric element.

* * * * *